(12) United States Patent
Roach et al.

(10) Patent No.: US 10,402,610 B2
(45) Date of Patent: Sep. 3, 2019

(54) PRINTED LEDS EMBEDDED IN OBJECTS TO PROVIDE OPTICAL SECURITY FEATURE

(71) Applicant: Nthdegree Technologies Worldwide Inc., Tempe, AZ (US)

(72) Inventors: Steven B. Roach, Gilbert, AZ (US); Richard A. Blanchard, Los Altos, CA (US); Eric Kahrs, Phoenix, AZ (US); Larry Todd Biggs, Queen Creek, AZ (US); Chye Kiat Ang, Singapore (SG); Mark D. Lowenthal, Vancouver, WA (US); William J. Ray, Fountain Hills, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 16/007,189

(22) Filed: Jun. 13, 2018

(65) Prior Publication Data
US 2018/0357522 A1    Dec. 13, 2018

Related U.S. Application Data

(60) Provisional application No. 62/518,862, filed on Jun. 13, 2017, provisional application No. 62/547,017, (Continued)

(51) Int. Cl.
*G06K 7/10* (2006.01)
*H01L 25/075* (2006.01)
(Continued)

(52) U.S. Cl.
CPC ....... *G06K 7/10564* (2013.01); *G06K 19/047* (2013.01); *G06K 19/0708* (2013.01);
(Continued)

(58) Field of Classification Search
CPC .......... B29K 2995/0026; G02B 6/0021; G02B 6/0065; G02B 6/0068; G02B 6/0073;
(Continued)

(56) References Cited

U.S. PATENT DOCUMENTS 9,443,180 B2    9/2016  Lowenthal
2014/0355298 A1*  12/2014  Meis ................... G02B 6/0083
                                                          362/602

(Continued)

*Primary Examiner* — Sonji N Johnson
(74) *Attorney, Agent, or Firm* — Patent Law Group LLP; Brian D. Ogonowsky

(57) ABSTRACT

In one embodiment, a printed LED area comprises a random arrangement of printed LEDs and a wavelength conversion layer. The LED area is embedded in an object to be authenticated, such as a credit card or a casino chip. The object may include a light guide for enabling the generated light to be emitted from any portion of the object. In one embodiment, when the LEDs are energized during authentication of the object, the existence of light emitted by the object is sufficient authentication and/or provides feedback to the user that the object is being detected. For added security, the emitted spectrum vs. intensity and persistence of the wavelength conversion layer is detected and encoded in a first code, then compared to valid codes stored in the database. If there is a match, the object is authenticated.

18 Claims, 9 Drawing Sheets

Related U.S. Application Data filed on Aug. 17, 2017, provisional application No. 62/551,197, filed on Aug. 28, 2017, provisional application No. 62/556,935, filed on Sep. 11, 2017.

(51) Int. Cl.

| | | |
|---|---|---|
| *H01L 33/50* | (2010.01) | |
| *G06K 19/04* | (2006.01) | |
| *G06K 19/07* | (2006.01) | |
| *H01L 33/54* | (2010.01) | |
| *H01L 33/38* | (2010.01) | |
| *H01L 33/62* | (2010.01) | |
| *H02J 50/10* | (2016.01) | |
| *H02J 5/00* | (2016.01) | |
| *H04B 5/00* | (2006.01) | |

(52) U.S. Cl.
CPC ...... *G06K 19/0723* (2013.01); *H01L 25/0753* (2013.01); *H01L 33/505* (2013.01); *H01L 33/508* (2013.01); *H01L 33/38* (2013.01); *H01L 33/50* (2013.01); *H01L 33/54* (2013.01); *H01L 33/62* (2013.01); *H02J 5/005* (2013.01); *H02J 50/10* (2016.02); *H04B 5/0037* (2013.01); *H04B 5/0075* (2013.01)

(58) Field of Classification Search
CPC .... G02B 6/0083; G02B 6/0085; G02B 6/009; G02B 6/0046; G02B 1/111; G02B 6/0028; G06K 7/10564; G06K 19/0723; G06K 19/0708; G06K 19/047; H01L 33/508; H01L 25/0753; H01L 33/505; H01L 33/50; H01L 33/62; H04B 5/0075; H04B 5/0037; H02J 5/005; H02J 50/10
See application file for complete search history.

(56) References Cited

U.S. PATENT DOCUMENTS

| | | | |
|---|---|---|---|
| 2015/0248603 A1* | 9/2015 | Lowenthal | G06K 19/06112 235/375 |
| 2017/0191934 A1* | 7/2017 | Lawandy | G07D 7/1205 |
| 2017/0231043 A1* | 8/2017 | Kluge | H05B 33/0827 |

* cited by examiner

PRINTED LEDS EMBEDDED IN OBJECTS TO PROVIDE OPTICAL SECURITY FEATURE

CROSS-REFERENCE TO RELATED APPLICATIONS

This application is based on U.S. provisional application Ser. No. 62/518,862, filed Jun. 13, 2017; 62/547,017, filed Aug. 17, 2017; 62/551,197, filed Aug. 28, 2017; and 62/556,935, filed Sep. 11, 2017, all assigned to the present assignee and incorporated herein by reference.

FIELD OF THE INVENTION

This invention relates to using light emitting diodes (LEDs) for authenticating objects and, in particular, to embedding printed LEDs in objects, such as credit cards and casino chips, to provide ergonomic visual feedback to a user when such objects receive power from an external power source.

BACKGROUND

U.S. Pat. No. 9,443,180 is assigned to the present assignee and incorporated herein by reference. That patent discloses details of methods to print microscopic LEDs on a security label or directly on an object to be authenticated, where the LEDs are naturally randomly arranged within the security mark, such as within a 1 cm$^2$ area. For example, there may be 30-50 LEDs within the security mark, and each security mark is inherently different. In that patent, the optically detected specific arrangement of the LEDs constitutes the unique signature of the security mark.

It is desirable to expand on the general concept of using printed LEDs in an object to visually detect the emitted light for reasons including security and feedback.

SUMMARY

Various improvements and alternatives to the basic technology described in U.S. Pat. No. 9,443,180 are described.

In one embodiment, a credit card includes an induction coil that supplies power to LEDs embedded in the card to illuminate the LEDs while the card is being read, such as at a point of sale. Alternatively, a voltage directly applied to the standard smart card chip in the card is routed to the LEDs to illuminate the LEDs. The card may act as a light guide to cause the light to be emitted from any portion of the card surface. This not only gives visual feedback to the user that the card is being read, but also provides added security since a counterfeiter would find it very difficult to replicate the visual effect.

A similar technology may be applied to casino chips or other valuable objects. Regarding a casino chip, poker tables or pay out stations may be equipped with an energy source that inductively supplies power to an induction coil in the chip. This powers the LEDs in the chip, and a light guide in the chip causes any portion of the chip to light up. Such an effect is extremely difficult to duplicate, so there is added security.

Since the emitted light from the object is visually detected by a user, there may be no need for expensive optical detection equipment in order to authenticate the object.

To add a secondary degree of security, the LEDs are coated with a wavelength conversion material, such as phosphor or quantum dots, prior to printing, or a wavelength conversion layer is provided over the LEDs. The wavelength conversion material absorbs some of the relatively short wavelength primary light and emits longer wavelength secondary light having any spectrum vs. intensity pattern. These materials may be designed to have a certain spectrum vs. intensity, or certain absorption wavelengths, or certain persistences that make it very difficult to reproduce or easily detect. In such an embodiment, the emitted light from the object contains a signature that can only be analyzed using a camera and processing equipment to add a much higher level of security.

In another embodiment, a simple circuit may also be added to the object that powers the LEDs in a certain way, such as by pulsing the LEDs in a coded pattern that may convey information. Such information may be the value of a casino chip and adds an added degree of security.

Other enhancements of the concepts described in U.S. Pat. No. 9,443,180 are also described.

BRIEF DESCRIPTION OF THE DRAWINGS

Elements that are similar or identical in the various figures are labeled with the same numeral.

DETAILED DESCRIPTION

In one general embodiment of the invention, a printed LED area is contained in an object that is energized by an induction coil or a voltage applied directly to pads on the object. Wavelength conversion materials may be used to generate any color. The object may provide light guiding to cause the emitted light to appear anywhere on the object. When the object is being detected, power is applied to the LEDs and the resulting light is visually observed by the user. Such light may be used for authentication or just to show that the object is being detected. In the examples shown, the object is a credit/debit card or a casino chip. An RFID chip may also be embedded in the object to provide additional information.

In another general embodiment of the invention, the particular pattern of LEDs and/or the optical signature of the wavelength conversion material is detected by a camera and compared to a stored signature to authenticate the object.

Figure 1:
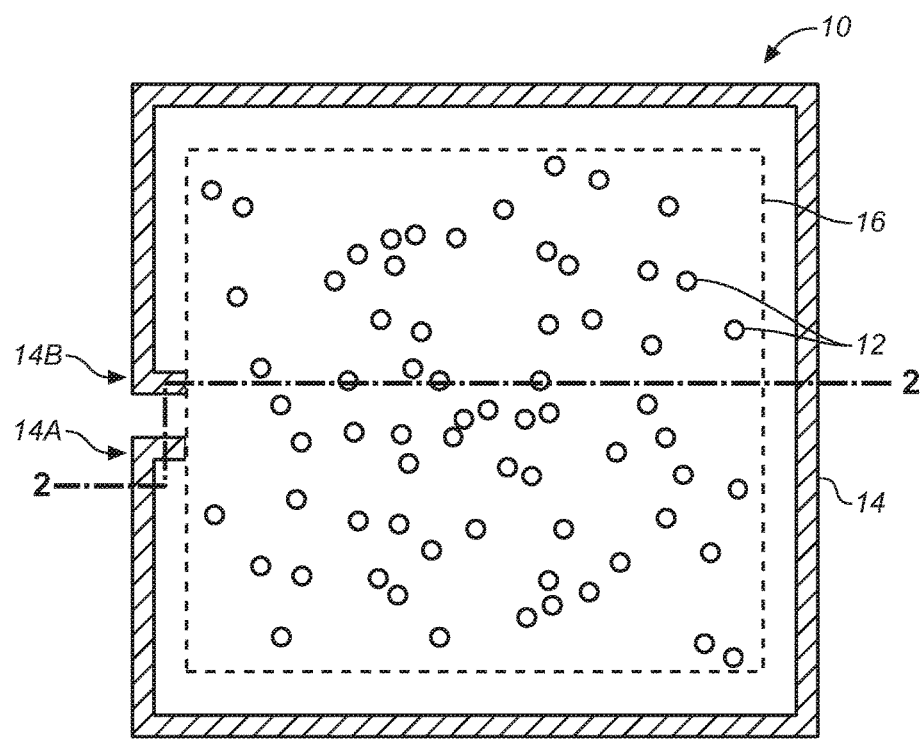
FIG. 1 is a top down view of an area containing a random array of printed LEDs and an inductive loop for powering the LEDs. A wavelength conversion layer may be provided over the LEDs.

FIG. 1 is a top down view of an area 10 of randomly arranged printed LEDs 12 and a metal inductor loop 14 for powering the LEDs 12. The inductor loop 14 may be formed anywhere on an object containing the LEDs 12 and not necessarily proximate to the LEDs 12. Each LED 12 may be coated with a phosphor, dyes, or quantum dots having customized characteristics, or a layer of phosphor, dyes, or quantum dots (or a mixture) may overlie or underlie the LEDs 12.

The perimeter of the printed LED layer (i.e., where the LED ink is printed) is shown by the dashed line 16. The area 10 may be smaller than a postage stamp (e.g., less than 1 square inch). The area 10 may be made as a sheet or roll in a high speed roll-to-roll process, then singulated and affixed to the object. Alternatively, the area 10 may be printed directly on the object. The cost per area 10 may be on the order of a penny. The object to be authenticated may be a credit card, casino chip, passport, license, bank note, etc.

Depending on the drive technique used and the amount of power that must be delivered to adequately light all the LEDs 12 in the lamp, the inductor loop 14 may be printed as a flat spiral or rectangular coil of two or more turns to form a secondary coil in order to efficiently couple with a primary drive coil producing an oscillating magnetic field. For two or more turns, the innermost loop connects to a first lamp electrode (e.g., an anode) and an additional insulating layer must be printed over the coil loops so that an electrical trace connecting the end of the outermost winding of the spiral coil may cross over the inner loops of the spiral coil and make electrical contact with a second lamp electrode (e.g., a cathode) to complete the lamp-coil circuit.

Alternatively, the LED layer may be powered by directly probing the anode and cathode terminals with a voltage, such as done when powering a smart card chip in credit card readers.

Figure 2:
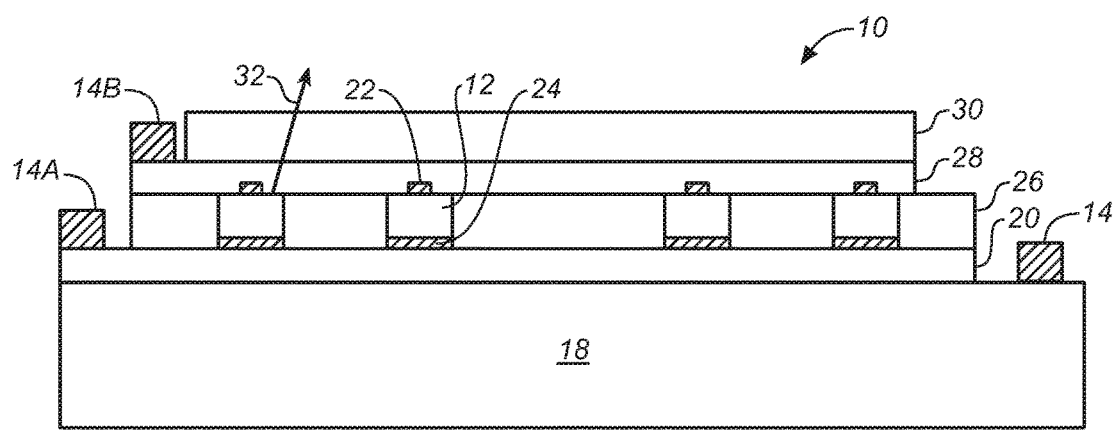
FIG. 2 is a cross-section of the area of FIG. 1 along line 2-2 in FIG. 1, showing only a few of the LEDs, whose relative sizes have been greatly enlarged. A wavelength conversion layer is provided over the LEDs.

FIG. 2 is a simplified cross-section of the area 10 of FIG. 1 along line 2-2 in FIG. 1, showing only a few of the LEDs 12, whose relative sizes have been greatly enlarged for illustration.

The area 10 may be formed as follows.

In FIG. 2, a starting substrate 18 may be polycarbonate, PET (polyester), PMMA, Mylar or other type of polymer sheet, or even a thin metal film, paper, cloth, or other material. In one embodiment, the substrate 18 is about 12-250 microns thick and may include a release film.

A conductor layer 20 is then deposited over the substrate 18, such as by printing. The substrate 18 and conductor layer 20 may be essentially transparent. For example, the conductor layer 20 may be ITO or a sintered silver nano-wire mesh. If light is to be emitted in the direction opposite to the substrate 18, the substrate 18 or conductor layer 20 may be reflective.

A monolayer of microscopic inorganic LEDs 12 is then printed over the conductor layer 20. The LEDs 12 are vertical LEDs and include standard semiconductor GaN layers, including an n-layer, and active layer, and a p-layer. GaN LEDs typically emit blue light. The LEDs 12, however, when used with a phosphor, dye, or quantum dots, may instead emit UV light.

The GaN-based micro-LEDs 12 are less than a third the diameter of a human hair and less than a tenth as high, rendering them essentially invisible to the naked eye when the LEDs 12 are spread across the substrate 18 to be illuminated. This attribute permits construction of a nearly or partially transparent light-generating layer made with micro-LEDs. In one embodiment, the LEDs 12 have a diameter less than 50 microns and a height less than 20 microns. The number of micro-LED devices per unit area may be freely adjusted when applying the micro-LEDs to the substrate 18. The LEDs 12 may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 22 for each LED 12 is small to allow light to exit the top surface of the LEDs 12. The bottom metal electrode 24 is reflective (a mirror) and should have a reflectivity of over 90% for visible light. Alternatively, the bottom electrode may be made to be partially or fully transparent to allow light to be emitted in comparable amounts both upwards away from the substrate and downwards through the substrate 18. With either the solid bottom reflector electrode or the transparent bottom electrode option, there is also some side light, depending on the thickness of the LED. In the example, the anode electrode is on top and the cathode electrode is on the bottom.

Further detail on fabrication of microscopic LEDs and the printing of the LEDs to form a security label is described in U.S. Pat. No. 9,443,180.

The LED ink is then printed over the conductor layer 20. The orientation of the LEDs 12 can be controlled by providing a relatively tall top electrode 22 (e.g., the anode electrode), so that the top electrode 22 orients upward by taking the fluid path of least resistance through the solvent after printing. The anode and cathode surfaces may be opposite to those shown. The pattern of the LEDs 12 is random, but the approximate number of LEDs 12 printed per area 10 can be controlled by the density of LEDs 12 in the ink. The LED ink is heated (cured) to evaporate the solvent. After curing, the LEDs 12 remain attached to the underlying conductor layer 20 with a small amount of residual resin that was dissolved in the LED ink as a viscosity modifier. The adhesive properties of the resin and the decrease in volume of resin underneath the LEDs 12 during curing press the bottom cathode electrode 24 against the underlying conductor layer 20, creating a good electrical connection. Over 90% like orientation has been achieved, although satisfactory performance may be achieved with only 50% of the LEDs being in the desired orientation for a DC driven lamp design. 50% up and 50% down is optimal for lamps that are powered with AC, such as those driven through inductive coupling using the conductive loop powered lamp as seen in FIG. 1.

A transparent polymer dielectric layer 26 is then selectively printed over the conductor layer 20 to encapsulate the sides of the LEDs 12 and further secure them in position. The ink used to form the dielectric layer 26 pulls back from the upper surface of the LEDs 12, or de-wets from the top of the LEDs 12, during curing to expose the top electrodes 22. If any dielectric remains over the LEDs 12, a blanket etch step may be performed to expose the top electrodes 22.

To produce a transparent lamp or a lamp that emits upward and away from the substrate 18, conductor layer 28 may be a transparent conductor such as silver nano-wires, which is printed to contact the top electrodes 22. The conductor layer 28 is cured by lamps to create good electrical contact to the electrodes 22.

The LEDs 12 in the monolayer, within a defined area, are connected in parallel by the conductor layers 20/28. Since the LEDs 12 are connected in parallel, the driving voltage will be approximately equal to the voltage drop of a single LED 12.

A wavelength conversion layer 30 may be printed or laminated over the transparent conductor layer 28. Alternatively, the wavelength conversion material may be deposited on the LEDs 12 prior to infusing the LEDs 12 in the solution. Still further, the wavelength conversion layer may be below the LEDs 12, where the bottom conductor layer 20 can be a transparent conductor.

Any metal pattern may then be printed for coupling an external power source to the conductor layers 20/28.

When the LEDs 12 are energized by a voltage potential across the conductor layers 20/28, very small and bright blue dots are created. A blue light ray 32 is shown. Some of the blue light may pass through the wavelength conversion layer 30 and add to the overall color emitted by the wavelength conversion layer 30. Alternatively, all LED light may be absorbed by the wavelength conversion layer 30 and converted to secondary light of a longer wavelength. Any emitted frequency spectrum can be customized.

The particular characteristics of the light emitted by the wavelength conversion layer 30 can be customized to provide a primary or secondary security criterion, as described in more detail later. For example, the wavelength conversion layer 30 may be customized for light persistence, wavelength spectrum vs. intensity, or other characteristic, and combinations of characteristics. When the emitted characteristics are combined with the random locations of the LEDs 12, a multi-level security system is created that is virtually impossible to replicate.

Alternatively, the random arrangement of the LEDs 12 and the specific characteristics of the emitted spectrum are not relevant to the optical detection, and only the fact that light is emitted from the object is needed for authentication or to show the user that the object is being read. In such a case, no camera is needed to detect the light.

For ease in energizing the LEDs 12, current through the metal inductor loop 14 is generated by inductive coupling. The inductor loop 14 may be formed by printing a metal pattern contacting the conductor layers 20/28. FIG. 2 shows a cross-section of the inductor loop end portion 14A contacting a small extension of the conductor layer 20, and another cross-section (taken at a different location) of the inductor loop end portion 14B contacting a small extension of the conductor layer 28. A majority of the inductor loop 14 is formed on the dielectric substrate 18, and a somewhat vertical conductive trace connects the inductor loop 14 to the upper end portion 14B. Each step in the vertical stair-step like rise between the portions 14A and 14B is typically less than 10 μm and so is easily traversed by a printed trace of either an opaque reflective conductive ink or a partially or substantially transparent conductive ink. A sufficient current induced in the inductor loop 14 in the proper direction will forward bias the LEDs 12 to illuminate them. A suitable value resistor may also be printed between the inductor loop 14 and the conductor layers 20/28 to limit current. Alternatively, an inductor coil that is formed separately may be electrically connected to the LED electrodes.

As previously mentioned, a direct probe of the anode and cathode electrodes connected to the conductor layers may also be used to energize the LEDs 12. If power is not available, the wavelength conversion layer 30 or the phosphor or quantum dots directly on each LED 12 may be energized by a blue or UV external light to determine the locations of the dots and the characteristics of the wavelength conversion material.

The bottom of the substrate 18 may be coated with an adhesive for affixing to an article to be authenticated. Alternatively, the substrate 18 may be a surface of the object to be authenticated.

The area 10 is very flexible and has a thickness on the order of paper or cloth, such as between 5-13 mils.

The areas 10 may be formed using a roll-to-roll process where the LEDs 12 and other layers are continuously printed on a single substrate 18 and then singulated. One surface of the areas 10 may have a tacky adhesive applied to them, and the areas 10 may then be applied to a wax film for creating inexpensive rolls of many areas 10. Since the positions of LEDs 12 for each area 10 are random when printed, the pattern of LEDs in each area 10 will be different and unique.

FIGS. 3-6 illustrate an embodiment of the security system used with credit cards or debit cards. The embodiments include using light guides to verify to the user that the LED area is being energized, and using various powering techniques for energizing the LED area. In the embodiments shown in FIGS. 3-6, the security is provided by the fact that the user sees the light being emitted by the credit card. The precise pattern of LEDs and the precise emitted spectrum is not detected by any camera, so expensive equipment is not used for the security system.

Figure 3:
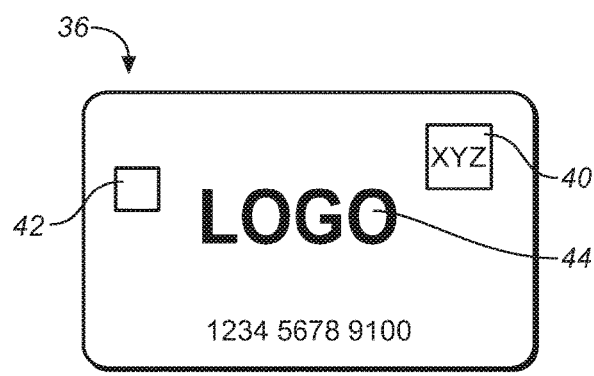
FIG. 3 is a front view of a credit or debit card incorporating a micro-LED array as well as light guiding structures for guiding light throughout the card and emitting light through the top and sides of the card.

FIG. 3 is a front view of a credit card 36 containing an LED area 40 that is printed directly on the credit card 36 when manufacturing the card 36 using a high speed process. Alternatively, the LED area 40 may be pre-printed and affixed to the card 36. A conventional smart card chip 42 is also contained in the card 36. The card 36 is typically formed of a plastic, and graphics 44 are printed on the card 36, such as the type of card, the card number, and the owner's name.

Figure 4:
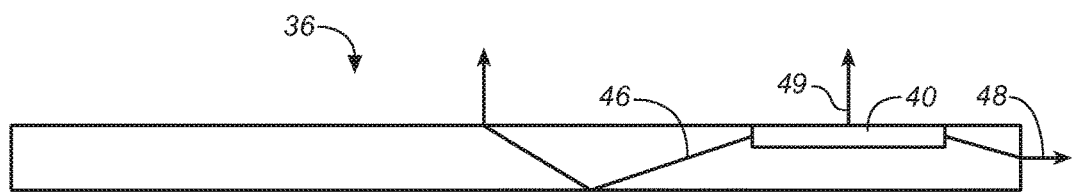
FIG. 4 is a cross-section of the card of FIG. 3 showing side light from the light engine being light-guided by the card.

FIG. 4 is a cross-sectional view of the card 36 of FIG. 3 with features exaggerated for simplicity. The smart chip is not shown. The LED area 40 generates side light and possibly downward light that is internally reflected within the transparent plastic forming the card's body. A light ray 46 is shown being emitted by the side of the area 40 and reflected by total internal reflection (TIR) until the light exits a surface of the card. Light extraction features may include molded microscopic prisms, or a roughening of the surface, or printed non-opaque graphics on the card 36. Some or all of the graphics may even be fluorescent so as to glow when energized by the LED light. The light 49 emitted from the top of the area 40 is also shown.

When the card 36 is inserted into a card reader equipped with a power source, the LEDs are powered by either an induction coil or by the voltage probes used to energize the smart card chip 42. The user sees the card glowing and the edges bright, such as by the light ray 48. The top face of the card 36 also emits light, such as by highlighting any printed graphics. A logo may also be superimposed over the LED area 40.

Figure 5:
FIG. 5 is an exploded view of a card body, containing a light engine and smart chip, and a laminated top layer containing graphics.

FIG. 5 illustrates an exploded perspective view of the credit card 36. The top layer 50, containing the graphics, may be a thin transparent layer laminated over a transparent substrate layer 52 (e.g., polycarbonate) for appearance and protection. The LED area 40 on the substrate layer 52 is exposed through a window 54 in the top layer 50, and the smart card chip 42 is exposed through another window 56.

An inductor coil 58, on the substrate layer 52, supplies power to the LEDs in the area 40 when the card 36 is being detected. The coil 58 may be separately formed on a thin polymer sheet that is laminated over the substrate layer 52. The LED area 40 may also be separately formed on a thin polymer sheet and laminated so that electrodes in the LED area 40 electrically contact electrodes of the coil 58 (or other circuit). When the LEDs are energized, the side light optically couples into the substrate 52 and top layer 50 and is waveguided throughout the card 36 until the light exits the top or side surfaces of the card 36. Alternatively, the LEDs may be powered by a DC voltage directly coupled to the Vcc and ground pads of the smart card chip 42, obviating the need for the coil 58. A voltage doubler chip on the substrate layer 52 may be used to convert the Vcc voltage of 1.8 volts to 3.6 volts for powering the LEDs. A voltage doubler chip and rectifier may also be used between the inductor coil 58 and the LED area 40. Multiple coils may be used to power different electronic circuits in the card 36 in the presence of a magnetic field. An RFID chip may also be powered by the credit card reader.

The visible feedback to the user not only shows the user that the card 36 has the LED area 40 feature but is also cosmetically appealing. The side light that is waveguided may be different from the light emitted from the top of the area 40, since the side light may be mainly the LED primary light, such as blue, while the light emitted from the top of the area 40 may be a combination of the LED light and the secondary light from the wavelength conversion material, or only light from the wavelength conversion material.

Figure 6:
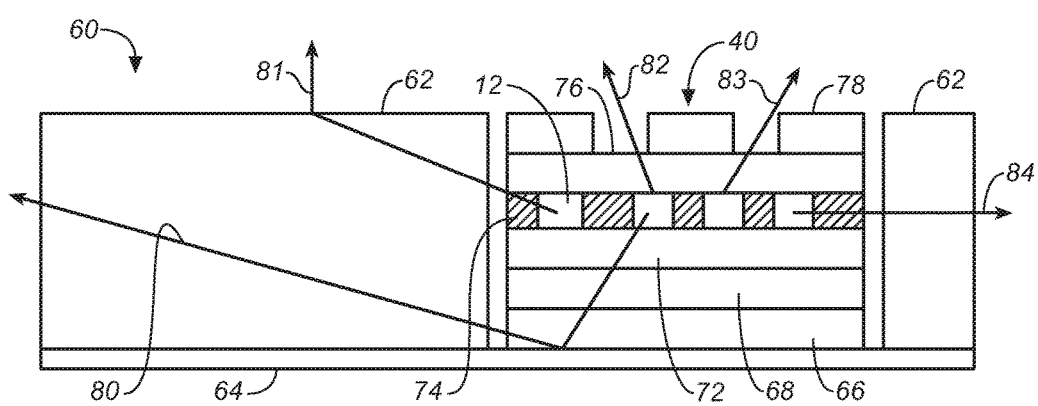
FIG. 6 is a cross-section of a credit card with a light engine showing how side light may be injected into a light guide credit card for being emitted from selected areas of the card. The light engine area is greatly exaggerated with respect to the card area.

FIG. 6 is a simplified and exaggerated cross-sectional view of a credit card 60, showing how the side light from the LED area 40 is injected into the body 62 of the credit card 60. In this particular design, the credit card 60 has a bottom reflective layer 64. A transparent light pipe layer 66 may form the bottom layer of the LED area 40, or may be part of the card body 62. Over the light pipe layer 66 is formed a customized wavelength conversion layer 68. Note that the portion of the area 40 taken up by the LEDs 12 is nominal compared to the open portions, so most of the light emitted by the wavelength conversion layer 68 may be through the front of the area 40, unless a reflective layer is provided over the area 40.

A transparent conductor layer 72 the then formed, followed by the printing and curing of the LED ink, resulting in the random arrangement of LEDs 12. A transparent dielectric layer 74 fills in the area between the LEDs 12, and a top transparent conductor layer 76 contacts the top electrodes to connect the LEDs 12 in parallel. A graphics layer 78 may be over the area 40.

Light rays 80-84 are shown being emitted in various directions and exiting the top of the area 40 as well as being light-guided by the credit card body 62. Light is also emitted by the wavelength conversion layer 68 in all directions.

Since there is no extra cost in fabricating the credit card 60 to provide the light guiding feature, there is synergy by adding this feature.

Figure 7:
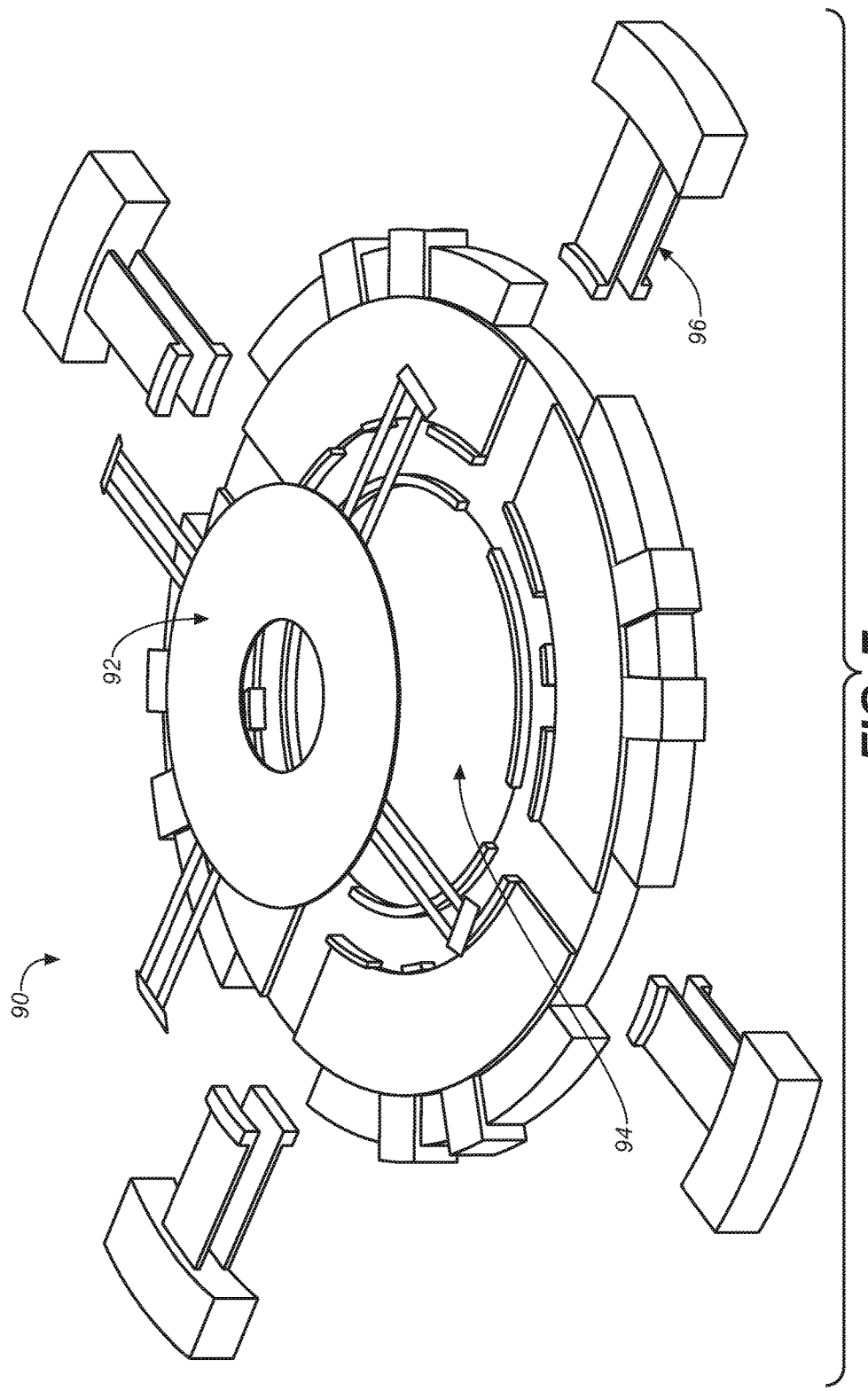
FIG. 7 is an exploded view of a poker chip (a casino chip) containing an induction coil, a light guide, and a micro-LED area.
Figure 8:
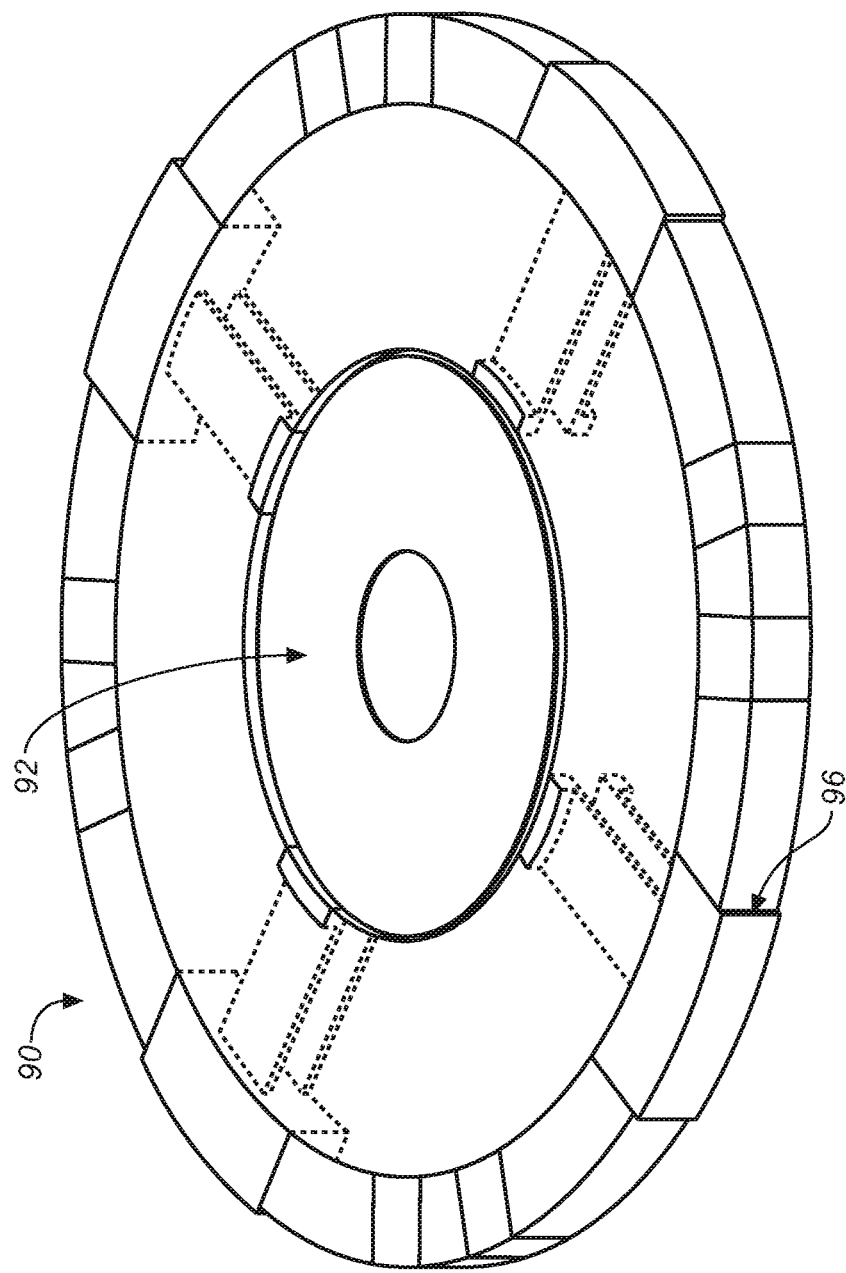
FIG. 8 illustrates the poker chip of FIG. 7 with the elements connected together.
Figure 9:
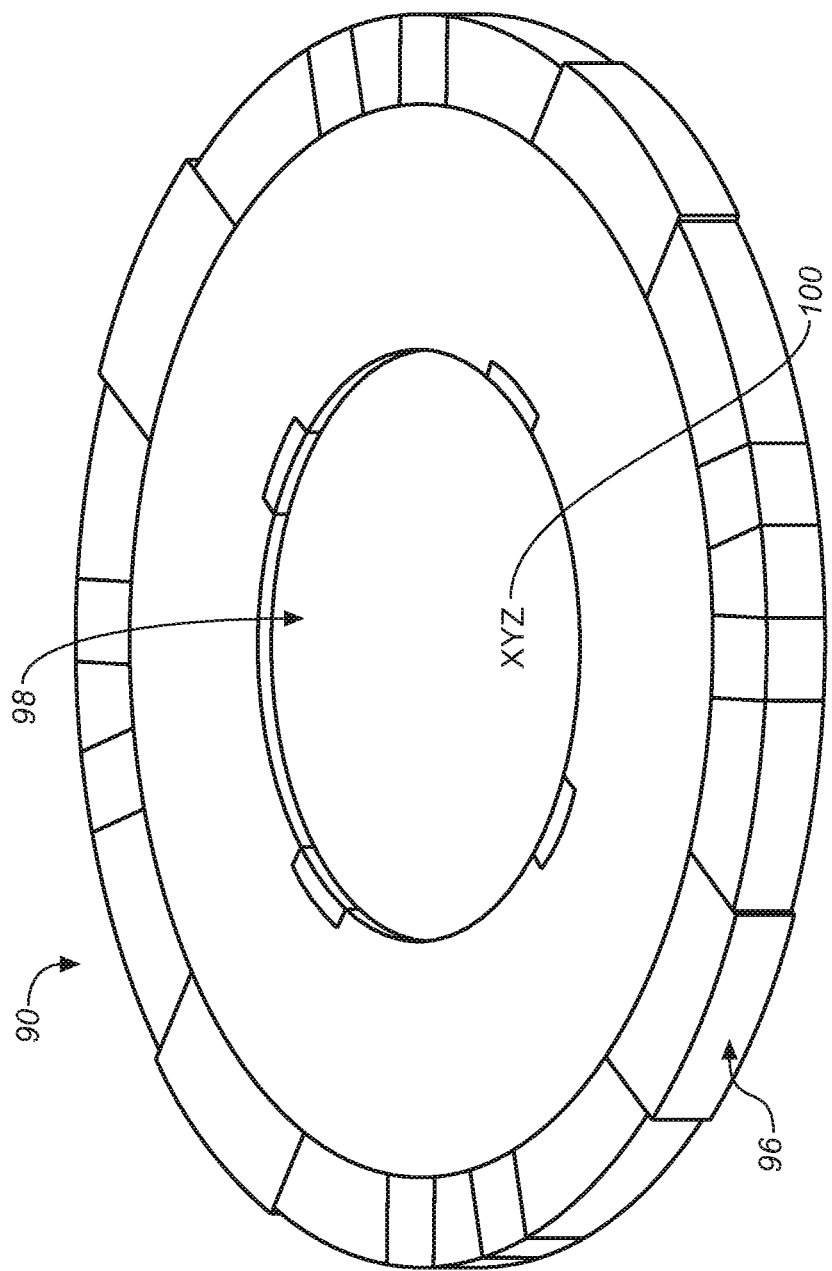
FIG. 9 illustrates the completed poker chip with printed graphics.

FIGS. 7-9 illustrate a similar technique applied to poker chips (casino chips) to not only add authentication but to illuminate the poker chips using light guiding.

FIG. 7 is an exploded view of a poker chip 90, which may be any casino chip used to make a wager. An inductive coil 92 powers the LED area 94 formed in the center area. Transparent light guide pieces 96 form part of the periphery of the chip 90 and receive side light from the LED area 94. The LED area 94 as well as any customized phosphor or dye layer are very difficult to counterfeit.

FIG. 8 shows the same chip 90 in a non-exploded view.

FIG. 9 shows the same chip 90 with a thin protective top layer 98. The layer 98 may or may not allow light to pass through. The top layer 98 includes graphics 100 to identify the value of the chip 90 and the casino. An RFID chip may also be incorporated to transmit information about the chip 90.

When the poker chip 90 is subjected to a suitable magnetic field, such as when the chip 90 is bet or during cashing out, the coil 92 energizes the LED area 94, and the edges are illuminated at the light guide pieces 96 to verify proper operation of the LED area 94.

Figure 10:
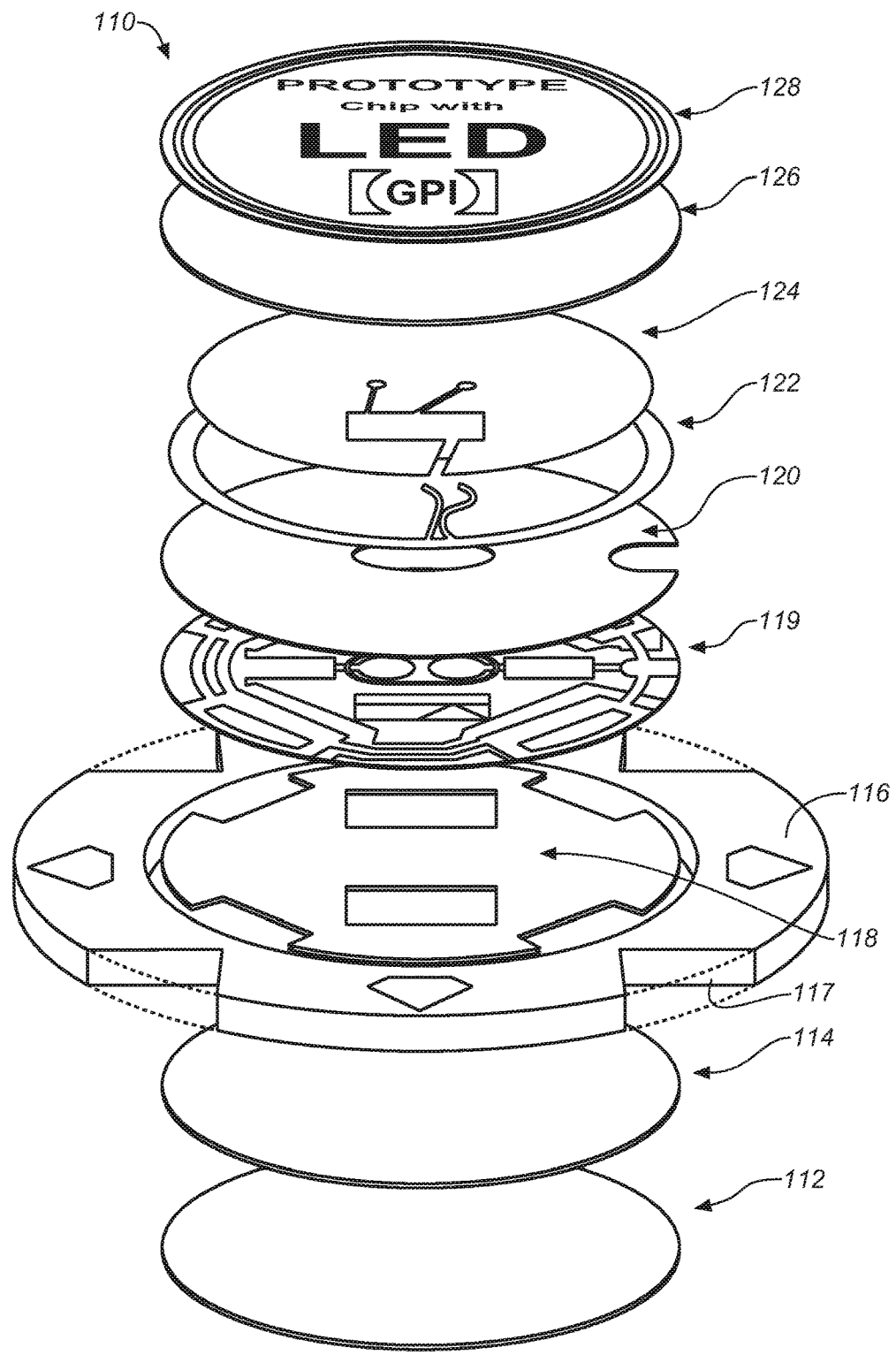
FIG. 10 is an exploded view of another embodiment poker chip using an induction coil, a light guide, and a micro-LED area.

FIG. 10 is an exploded view of a poker chip 110 having a different construction. In the chip 110 of FIG. 10, the light from the LEDs or a phosphor layer is emitted at the periphery of the chip 110 using light guiding within the chip 110. The characteristics of the phosphor layer may be varied for added security.

The phosphor characteristics may also (or only) be used to optically identify the denomination of the chip 110. In such a case, each denomination uses a different phosphor or combination of phosphors.

The layers are identified from the bottom up in FIG. 10. The bottom layer is a 4-color artwork label 112 showing suitable graphics. A light-blocking double-sided adhesive layer 114 affixes the label 112 to a solid slug 116 that includes a transparent central core for light guiding. The light can escape through transparent/translucent portions 117 near the periphery of the chip. A transparent epoxy layer 118 affixes the LED area 119 to the slug 116. The LED area substrate may include a voltage doubler and rectifier. The LED area 119 may include a phosphor, dye, or quantum dot layer having customized optical characteristics. A double-sided adhesive layer 120 affixes an induction coil 122 over the LED area 119, which electrically connects to the voltage doubler and rectifier for powering the LEDs. A Mylar spacer 124 is then provided, followed by a double-sided light blocking adhesive layer 126. A 4-color top label 128 is then provided over the central area of the chip 110.

Since the peripheral areas of the chip 110 are exposed, the light from the LED area 119 is light-guided in the chip 110 until it exits through the transparent or translucent areas 117.

In the above embodiments, only the existence of light being emitted from the object is enough to authenticate the object or convey other information about the object. However, the wavelength conversion layer emission may be customized to have complex optical characteristics. Some of these customized characteristics include a certain spectrum vs. intensity and a persistence. If such an added security feature is used, the spectrum of the light emitted from the object and/or the persistence of the phosphor or dye layer is optically detected by a camera and digitally encoded. The code is then later compared with a stored code in a database to authenticate the object.

FIGS. 11-15 relate to forming a wavelength conversion material having customized characteristics that are very difficult to accurately reproduce. Additionally, the wavelength conversion material may be changed from time to time during the manufacturing process to further enhance security. Characteristics that may be customized include the persistence of the light after the LEDs have turned off, where the persistences of different phosphors or dyes in a mixture may be different and associated with different frequency spectrums. The spectrum vs. intensity can be customized, and absorbing materials may form notches in the spectrum vs. intensity graph. Multiple phosphors or dyes may be combined to form a highly complex spectrum vs. intensity graph with different persistences. Other customized characteristics are envisioned.

Figure 11:
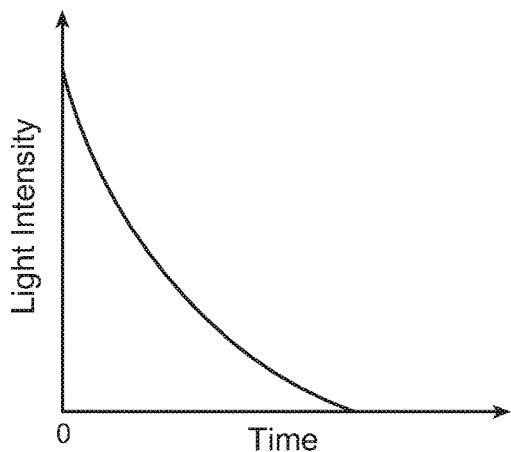
FIG. 11 illustrates the light intensity persistence vs. time of a certain customized phosphor or dye that has been energized with a pulse of blue or UV light at time 0.

FIG. 11 illustrates how, at time 0, the LEDs in the LED area in an object are pulsed to energize a single phosphor or dye type. The decay of the light intensity for selected wavelengths is shown. Phosphors or dyes may be customized to have a wide variety of persistences. The phosphor wavelengths and its persistence is the security feature in such an embodiment. The characteristics are stored in a database and then compared with a transmitted code when authenticating the object.

Figure 12:
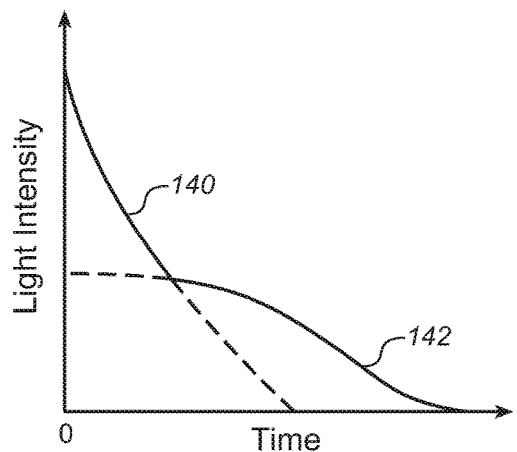
FIG. 12 illustrates the light intensity persistence vs. time of a certain customized phosphor or dye that has been energized with a pulse of blue or UV light at time 0, where the phosphor or dye is composed of two different phosphors or dyes having different persistences, and optionally different wavelength spectrums.

FIG. 12 illustrates how the phosphor or dye light output can become much more complex when combining phosphors or dyes. Only two phosphors or dyes are combined in FIG. 12, but many more phosphors or dyes can be combined with different spectrums and persistences. In the example, the graph 140 may be associated with one type of phosphor or dye, such as one emitting a first spectrum, and the graph 142 may be associated with another type of phosphor or dye emitting a second spectrum or the same spectrum. Both persistences may be independently measured if they apply to different spectrums, which may be filtered to isolate the different phosphors. The relative combinations of two or more phosphors or dyes can be varied over time for high security.

Figure 13:
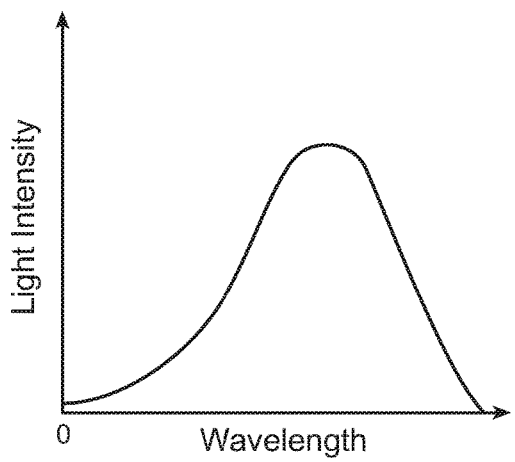
FIG. 13 illustrates the light intensity vs. wavelength of a customized phosphor or dye.

FIG. 13 illustrates how a customized phosphor or dye may have a characteristic emission spectrum, which is the wavelength of the emitted light vs. intensity of light over the spectrum.

Figure 14:
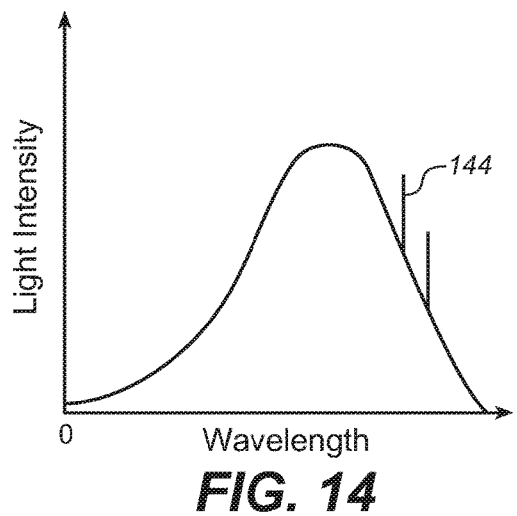
FIG. 14 illustrates the light intensity vs. wavelength of a customized combination of phosphors or dyes.

FIG. 14 shows how multiple phosphors or dyes can be combined to add spikes 144 at various wavelengths or any other perturbation in the graph. The graph may be made very complex by combining phosphors or dyes. Phosphors, dyes, and quantum dots may be combined to further increase the complexity.

Figure 15:
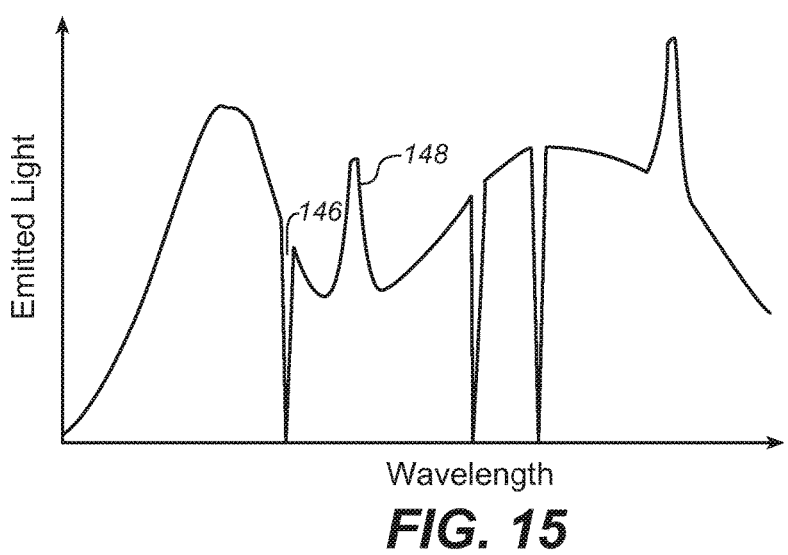
FIG. 15 illustrates a complex light intensity vs. wavelength of a customized combination of phosphors or dyes, where light emission wavelengths and absorption bands are detected for added security.

FIG. 15 illustrates a wavelength vs. intensity graph with multiple phosphors or dyes and wavelength absorbers. The absorbers absorb light at the desired wavelengths and produce the notches 146. The spikes 148 may be associated with other phosphors or dyes. A blend of other phosphors or dyes may produce the broad spectrum pattern.

The combination of the spectrum and persistences can provide very high security, in addition to the visual feedback to the user.

For detecting the precise characteristics of the emission from the object, a camera and processing system is needed as well as a database that stores a code that corresponds to the detected characteristics. Such systems are shown in FIGS. 16 and 17.

Figure 16:
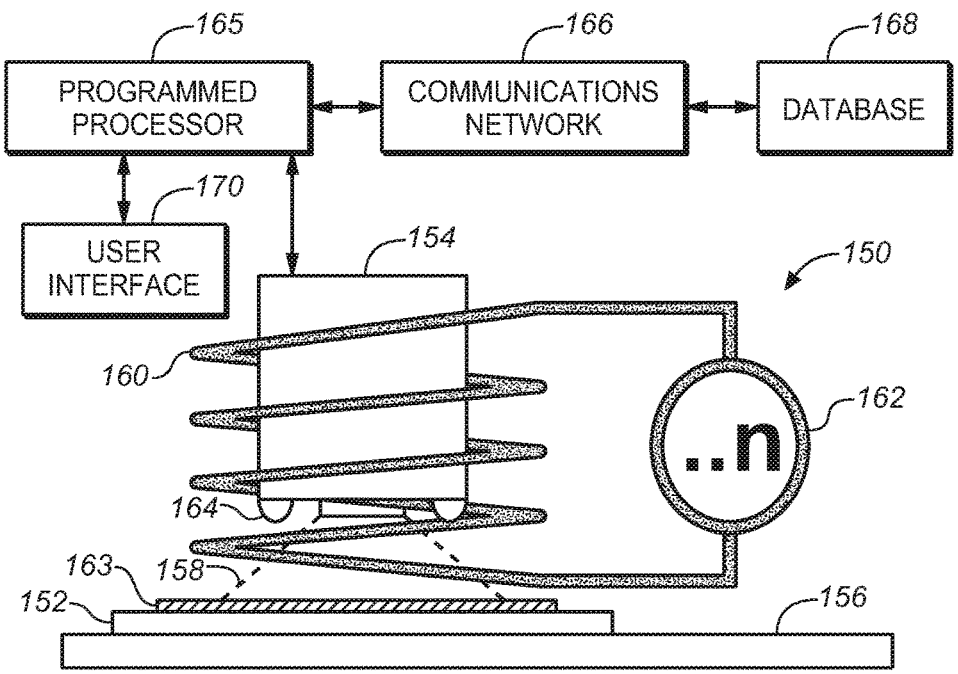
FIG. 16 illustrates a system for inductively powering the LEDs in an object, such as a credit card or casino chip, and optionally optically detecting the light pattern and wavelength conversion material characteristics, and communicating with a remote secure database for authenticating the object. The system may additionally include a UV source for energizing phosphor, dyes, or quantum dots.
Figure 17:
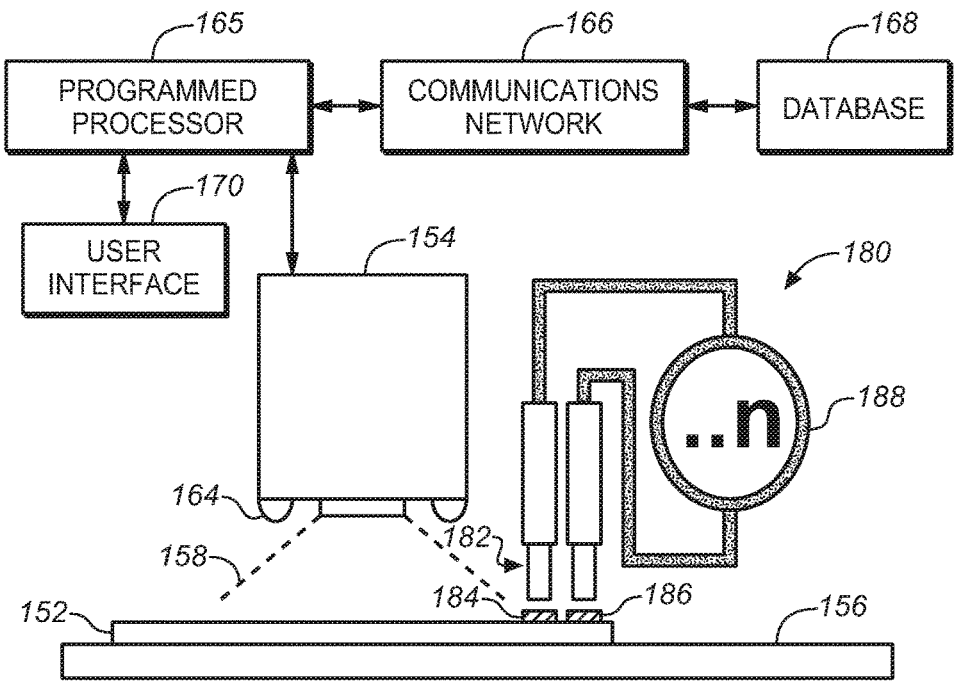
FIG. 17 illustrates a system for applying power to the LEDs in an object, such as a credit card or casino chip, and optionally optically detecting the light pattern and wavelength conversion material characteristics, and communicating with a remote secure database for authenticating the label. The system may additionally include a UV source for energizing phosphor, dyes, or quantum dots.

FIG. 16 illustrates one embodiment of a detector 150 that powers the LEDs 12 and authenticates an LED area 152. If the authentication only requires that some light be emitted, then a camera and processing circuitry is not needed.

The LED area 152 (or any light output area) is positioned in front of a digital imager 154, such as a camera. If the LED area 152 is in a credit card, a card reader would be equipped with the detector 150.

The imager 154 may be hand held. The same type of detector 150 may also be used during manufacturing of the LED area 152 to store the unique code conveyed by the dot pattern and wavelength conversion material. FIG. 16 shows the LED area 152 supported on a surface 156, which may be the object to be authenticated. The field of view of the imager 154 is shown by the dashed lines 158.

A metal coil 160 (the primary coil) centered over the LED area 152 is then energized by one or more pulses from a power supply 162 to create an electromagnetic field. An AC signal may also be applied to the coil 160. The electromagnetic field induces a current through the inductor loop 163 on the object and forward biases the LEDs 12 to continuously or briefly illuminate them.

Power may be transferred using either an RF field produced by continuous AC power to the coil 160 or pulsed, using a flyback drive approach. Driving the coil 160 with continuous AC, with a frequency from 10 kHz to 100's of kHz, will light LEDs of both orientations, with one population of LEDs lit during each half of the AC cycle, and a blue dot pattern will coincide with the locations of every printed LED 12. Alternatively, low duty-cycle square wave pulses, with a frequency from 10 KHz to 100's of kHz, may be used to induce a current in the inductor loop with a voltage high enough to light LEDs of one orientation each time the current is supplied to the coil 160. If the inductor loop is printed such that it has a high enough series resistance, the induced voltage signal then damps out to below the micro-LED turn-on voltage of the LEDs as the voltage in the coil 160 and loop swings to the reverse polarity. This permits the LED driver to selectively light only the "down" or the "up" LEDs so that the digital imager 154 may take an exposure of the lit LED area 158 that spans multiple driver cycles. The polarity of the pulses in the coil 160 is used to select whether the "up" or "down" LEDs 12 are to be lit. The combined pattern of up and down LEDs may be part of the unique code.

Further details of a technique to energize LEDs using an inductor coil and a driver may be found in U.S. Pat. No. 8,413,359, assigned to the present assignee and incorporated herein by reference.

The detection system may simply determine that the emitted light meets a certain criterion for authentication. In such a case, the optical properties may only need to be compared to data in a local database in the reader. However, if the optical properties are unique for each object, or changes from batch to batch, such properties may be initially stored in a remote database and then compared with the detected properties, such as at the point of sale of the object.

The following description may apply where the optical properties of the light emitted by the object are used to authenticate the object.

Once the random arrangement of dots is illuminated, either by energizing the LEDs 12 or using an external light source 164 to excite phosphor, a programmed processor/memory system 165 connected to the imager 154 records the image (including the characteristics of the wavelength conversion material) and generates the unique code for the dot pattern and secondary light characteristics in the same manner as the code was generated during the manufacture of the LED area 152. Any other identifying mark on the area 152, such as a serial number, is also optically detected and associated with the unique code. A printed serial number on the article itself, such as a passport, banknote, license, or certificate, may also be optically detected by the imager 154 and ultimately cross-referenced with the unique code.

The unique code and other optically detected information are then transmitted via a communications network 166 to a secure database 168. The user uses a user interface 170 to control the authentication process and receive the authentication information. The user interface 170 may be a simple button pad with a display.

The database 168 then compares the dot code and wavelength conversion material characteristics code to a stored code and, if there is a match, the object is deemed authentic. The optically detected label serial number (or other printed code) may also be detected, and both codes are compared with associated codes in the database 168 for additional security. The identification that the object is authentic may be transmitted to a display in the user interface 170, or other systems may be used to register that the object is authentic or not authentic.

FIG. 17 illustrates a detector 180 for authenticating the LED area 152. All elements are the same as the detector 150 of FIG. 16 except for metal probes 182, for applying a voltage to the anode and cathode pads 184/186 on the object, and a polarity switchable DC voltage source 188, which can be used to selectively illuminate LEDs 12 in each orientation. A simple AC voltage source may be used to illuminate both orientations of LEDs 12 without orientation selectability. Such a detector 180 may be located in a credit or debit card reader and also be used to power a smart chip in the card.

As previously mentioned, even an external blue or UV light source 164 may energize the wavelength conversion material to detect its customized characteristics to authenticate the object. In such a case, the random arrangement of the LEDs 12 may not be relevant.

In another embodiment, the light-generating devices do not use LEDs, and only phosphor particles and/or quantum dots are printed on the substrate. The phosphor or quantum dot particles may be directly dispersed in an ink at a low concentration so that no substrate is needed. The ink solvent is evaporated, leaving the wavelength-conversion particles randomly scattered on the label surface. No voltage source or conductor layers are needed. The randomness is a natural result of the printing process. An external UV or blue light source energizes the particles instead of using LEDs. The level of security may be less than that when using LEDs but the security may be sufficient for lower value items. In such a case, the dots in FIG. 1 represent the wavelength conversion particles rather than LEDs.

In another embodiment, a simple circuit may also be added to the object that powers the LEDs in a certain way, such as by pulsing the LEDs in a coded pattern that may convey information. Such information may be the value of a casino chip and adds an added degree of security.

All features described herein may be combined in various combinations to achieve a desired function.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An authentication system comprising:
a wavelength conversion material on or within a portable object, the object containing information to be electronically detected, the wavelength conversion material for converting primary light to secondary light;
one or more light emitting diodes (LEDs) on or within the object for energizing the wavelength conversion material;
a power receiving circuit on or within the object for receiving power from a power source, external to the object and not permanently connected to the object, for supplying power to the LEDs to illuminate the LEDs when the object is proximate to the power source,
the LEDs for energizing the wavelength conversion material when the object is being electronically detected; and
a detection system for detecting one or both of a spectrum vs. intensity characteristic of the wavelength conversion material or a persistence characteristic of the wavelength conversion material and comparing the spectrum vs. intensity characteristic or the persistence characteristic of the wavelength conversion material to data in a database relating to the spectrum vs intensity characteristic or the persistence characteristic for authenticating the object.

2. The system of claim 1 wherein the object is a credit or debit card, or a casino chip.

3. The system of claim 1 wherein the wavelength conversion material has the spectrum vs. intensity characteristic that is detectable for authenticating the object.

4. The system of claim 1 wherein the wavelength conversion material has the persistence characteristic that is detectable for authenticating the object.

5. An authentication system comprising:
a detection system configured for detecting light emitted by wavelength conversion material on or within a portable object, the wavelength conversion material for converting primary light to secondary light,
the detection system configured for detecting one or both of a spectrum vs. intensity characteristic of the wavelength conversion material or a persistence characteristic of the wavelength conversion material and comparing the spectrum vs. intensity characteristic or the persistence characteristic of the wavelength conversion material to data in a database relating to the spectrum vs intensity characteristic or the persistence characteristic for authenticating the object, the detection system configured for identifying whether the object is authenticated;

one or more light emitting diodes (LEDs) on or within the object for energizing the wavelength conversion material; and a power receiving circuit on or within the object for receiving power from a power source, external to the object and not permanently connected to the object, for supplying power to the LEDs to illuminate the LEDs when the object is proximate to the power source.

6. The system of claim 5 wherein the power receiving circuit comprises an inductor loop for converting an electromagnetic field generated by the external power source to a voltage for powering the LEDs.

7. The system of claim 5 wherein the power receiving circuit comprises conductive pads for receiving a voltage generated by the external power source for powering the LEDs.

8. The system of claim 5 wherein the wavelength conversion material has the spectrum vs. intensity characteristic that is detectable for authenticating the object.

9. The system of claim 5 wherein the wavelength conversion material has the persistence characteristic that is detectable for authenticating the object.

10. The system of claim 5 wherein the object includes an RFID circuit for conveying information about the object.

11. The system of claim 5 wherein the detection system comprises:

an optical detector for detecting the spectrum vs intensity characteristic or persistence characteristic of the wavelength conversion material; and a processing system coupled to the detector and configured to generate a first code corresponding to the spectrum vs intensity characteristic or persistence characteristic of the wavelength conversion material;

wherein the processing system determines whether the first code matches a stored code to determine whether the object is authenticated.

12. The system of claim 11 wherein the optical detector is configured for detecting at least the spectrum of light emitted by the object, wherein the spectrum has been customized to have a particular spectrum vs. intensity characteristic; and wherein the processing system is coupled to the detector and configured to generate the first code that contains information related to the spectrum vs. intensity characteristic of the light.

13. The system of claim 11 wherein the optical detector is configured for detecting at least the persistence of light emitted by the object, after the primary light has been turned off, wherein the persistence has been customized to have a particular persistence characteristic; and wherein the processing system is coupled to the detector and configured to generate the first code that contains information related to the persistence characteristic of the light.

14. The system of claim 5 further comprising:

a light guide within the object for guiding light when the LEDs are illuminated, wherein the wavelength conversion material is provided over at least a portion of the light guide for energizing the wavelength conversion material when the LEDs are illuminated.

15. The system of claim 14 wherein the object is a credit or debit card, and a body of the credit card or debit card acts as the light guide.

16. The system of claim 14 wherein the object is a casino chip, and a body of the casino chip acts as the light guide.

17. The system of claim 14 wherein the LEDs are not directly seen so that only the light exiting the light guide is visible.

18. A method for authenticating an object comprising:

providing a wavelength conversion material on or within a portable object, the wavelength conversion material for converting primary light to secondary light, the wavelength conversion material being designed to have a particular spectrum vs. intensity characteristic or a persistence characteristic;

energizing one or more light emitting diodes (LEDs) on or within the object for energizing the wavelength conversion material;

receiving power from a power source, external to the object and not permanently connected to the object, for supplying power to the LEDs to illuminate the LEDs when the object is proximate to the power source;

detecting light emitted by the wavelength conversion material on or within the object;

detecting one or both of a spectrum vs. intensity characteristic of the wavelength conversion material or a persistence characteristic of the wavelength conversion material;

comparing the spectrum vs. intensity characteristic or the persistence characteristic of the wavelength conversion material to data in a database relating to the spectrum vs intensity characteristic or the persistence characteristic for authenticating the object; and identifying whether the object is authenticated.

* * * * *